United States Patent [19]

Fournier

[11] Patent Number: 4,486,287
[45] Date of Patent: Dec. 4, 1984

[54] CROSS-FIELD DIODE SPUTTERING TARGET ASSEMBLY

[76] Inventor: Paul R. Fournier, 980 Miramonte Dr., #4, Santa Barbara, Calif. 93109

[21] Appl. No.: 577,016

[22] Filed: Feb. 6, 1984

[51] Int. Cl.³ .............................................. C23C 15/00
[52] U.S. Cl. .................................. 204/192 R; 204/298
[58] Field of Search ............................ 204/298, 292 R

[56] References Cited

U.S. PATENT DOCUMENTS

| | | | |
|---|---|---|---|
| 4,006,073 | 2/1977 | Welch | 204/298 |
| 4,046,659 | 9/1977 | Cormia et al. | 204/298 |
| 4,155,825 | 5/1979 | Fournier | 204/298 |
| 4,209,552 | 6/1980 | Welch | 204/192 SP |
| 4,265,729 | 5/1981 | Morrison | 204/192 R |
| 4,404,077 | 9/1983 | Fournier | 204/298 |
| 4,422,896 | 12/1983 | Class et al. | 204/298 |

OTHER PUBLICATIONS

Mullaly, Research Develop., Feb. 1971, pp. 40-43.
Wasa et al., Transactions on Parts, Materials & Packaging, vol. PMP-3, #3, 1967, pp. 71-75.

Primary Examiner—Arthur P. Demers
Attorney, Agent, or Firm—Daniel J. Meaney, Jr.

[57] ABSTRACT

An improved cross-field diode sputtering target assembly adapted for sputtering a selected material having an ion target wherein a selected surface is formed of a selected material in a predetermined closed loop pattern having a central opening therein, and wherein the selected surface has spaced edges and is formed of a material adapted to be controllably eroded in a diode sputtering process, walls positioned contiguous or adjacent to each of the spaced edges of the selected surface wherein each of the walls extend substantially normal from and beyond each spaced edge of the selected surface of the ion target and a magnetic member having poles positioned in an opposed spaced relationship to each other and enclosing the walls and the ion target for providing a linear magnetic field (B) through the walls, over the selected surface and through the ion target and wherein the magnetic member has a linear magnetic field of sufficient strength for plasma entrapment between the walls and over the selected surface wherein the selected surface is adapted to have an electric field (E) applied thereacross at a direction substantially normal to the magnetic field (B) to develop a B×E field and to entrap secondary electrons at the selected surface to control the erosion pattern thereof is shown.

A method for utilizing the improved cross-field diode sputtering target assembly is also shown.

17 Claims, 6 Drawing Figures

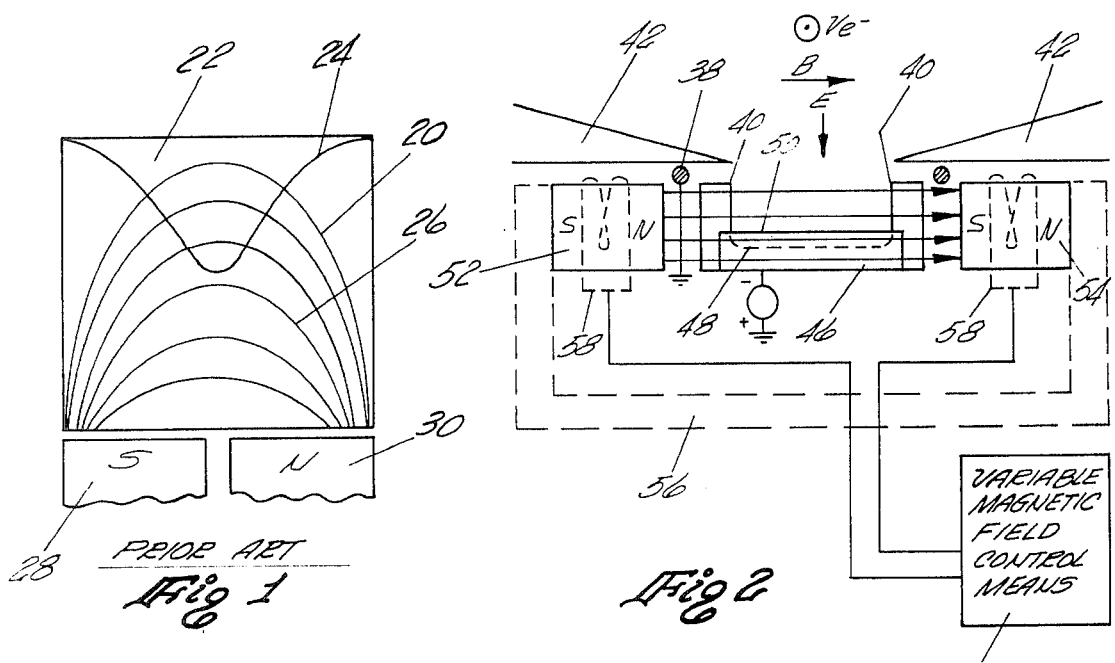
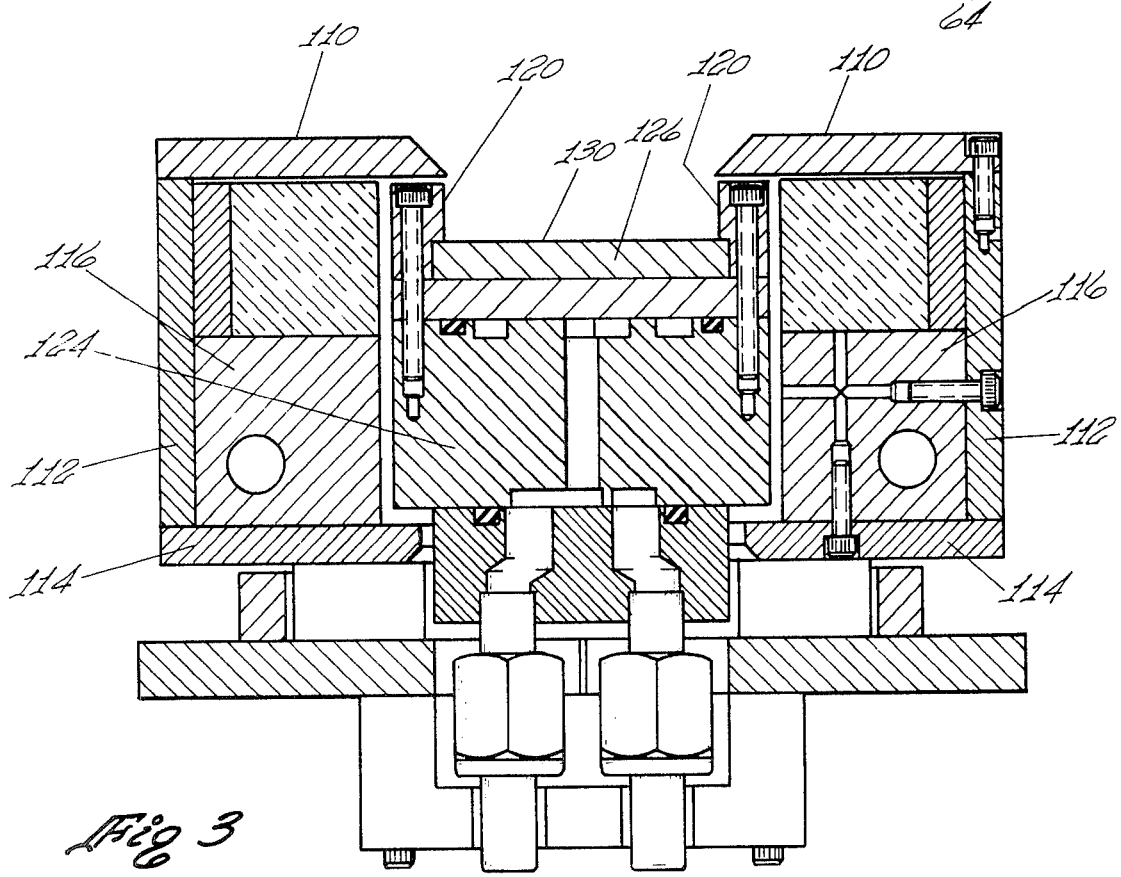

CROSS-FIELD DIODE SPUTTERING TARGET ASSEMBLY

BACKGROUND OF THE INVENTION

1. Field of the Invention

This invention relates to a target assembly adapted for use in diode sputtering systems and, more particularly, to an improved sputtering selected material therefrom in a controlled erosion pattern.

2. Description of the Prior Art

Triode sputtering apparatus, means and systems are well known in the prior art. Diode sputtering apparatus, means and systems are, likewise, well known in the prior art. The triode sputtering apparatus utilize separate anodes and cathodes for producing a source of electrons utilized in the formation of the plasma and the generation of the sputtered ions from the target material. A description of the known sputtering apparatus, means and systems and methods thereof, including use of magnetically enhanced triode target assemblies, is disclosed in U.S. Pat. No. 4,155,825 and U.S. Pat. No. 4,404,077, both of which were issued to the inventor of the present invention.

The use of a magnetically enhanced diode sputtering device, including magnetic means for establishing a magnetic field with the lines of force thereof extending over and passing through the sputtering surface of a target assembly, is disclosed in U.S. Pat. No. 4,265,729. In such magnetically enhanced diode sputtering devices, the magnetic means establishes a closed loop configuration of the lines of force across the target surface, wherein the closed loop configuration of the lines of force has at least some nonlinear portions. Separate flexible magnetic means may be utilized for enhancing the uniformity of magnetic field along the nonlinear portions in order to control the shape of the closed loop configuration of the lines of force through the target surface.

The known prior art devices which utilize the magnetic field to enhance sputtering of a target is illustrated in FIG. 1 identified as "Prior Art." In such devices, the target material 20 is eroded in a manner such that a conical surface 22, having a V-shaped cross section 24, is produced by the closed-loop configuration or arcuate-shaped configuration of the lines of force emanating from magnets 28 and 30. The results of the known prior art devices is to erode the target material in a conical-shaped method, resulting in a substantial portion of the target material 20 remaining unsputtered. This phenomenon results from the fact that, for sputtering to occur, the electric field E must cross the magnetic field B at substantially 90° to form a B×E field. As the conical-shaped surface 22 of the target material erodes in a conical shape, a trench forms in the target surface which results in a portion of the target material not being utilized. By use of moving magnets under the target surface, the trenching effects can be reduced.

The relationship which is required for establishing sputtering conditions is set forth in detail in U.S. Pat. Nos. 4,155,825 and 4,404,077, referenced hereinabove, and need not be set forth here in detail.

SUMMARY OF THE INVENTION

The improved cross-field diode sputtering target assembly of the present invention results in a unique and improved diode sputtering target assembly which increases the efficiency of the quantity of material which can be sputtered from a ion target in a diode sputtering apparatus.

The improved cross-field diode sputtering target assembly of the present invention includes an ion target which has a predetermined surface formed of a selected material to be sputtered. The ion target is formed into a predetermined closed pattern having a central opening therein and wherein the selected surface thereof has spaced edges. The selected surface is formed of a material which is adapted to be controllably eroded in a sputtering process. Means positioned contiguous to each of the spaced edges of the selected surface is provided for defining walls. The walls extend substantially normal from and beyond each of the spaced edges of a selected surface of the ion target. A magnetic means having poles is positioned in an opposed space relationship to each other and encloses the means for defining the walls and the ion target. The magnetic means produces a linear magnetic field (B) which is directed through the walls, over the selected surface of the ion target and through the ion target. The magnetic means has a linear magnetic field of sufficient strength for plasma entrapment between the sidewalls and over the selected surface. The selected surface is adapted to have an electric field (E) applied thereacross at a direction substantially normal to the magnetic field (B) to develop a B×E field and to entrap secondary electrons at the selected surface to control the erosion pattern thereof.

In the magnetically enhanced diode sputtering devices of the known prior art, the amount of target material that can be eroded is limited by the shape of the surface of the target material and upon the inherent B×E field relationship to maintain the sputtering condition. The magnetic field lines of force formed into a closed loop configuration also entrap the secondary electrons necessary to sustain the diode sputtering.

In diode sputtering apparatus, the use of a magnetically enhanced cathode does not permit diode sputtering apparatus to sputter a magnetic material due to the fact that the magnetic material forming the target concentrates the lines of flux of the magnetic enhancing means into the target and eliminates or significantly reduces the strength of the magnetic field such that the B×E field relationship is not maintained, and such that secondary electrons escape, degrading the sputtering or weakening the B field so that very little control of the erosion pattern of the diode sputtering target is possible.

Thus, one significant advantage of the present invention is that the erosion pattern of the ion target material selected surface can be specifically and selectively controlled to maximize both the erosion rate and the shape of the erosion pattern such that the required B×E field relationship is maintained across a substantial portion of the target surface, resulting in the highly efficient sputtering of the target material.

A yet further advantage of the present invention is that the magnetic means is positioned relative to the walls and the ion target such that a linear magnetic field is formed through the walls and over the selected surface of the ion target and through the ion target such that the ion target will not concentrate or deflect a substantial portion of the magnetic field external to the target material to significantly reduce the density of the magnetic field.

A yet further advantage of the present invention is that the linear magnetic field performs a dual function, namely, (1) as a cap or cover for the plasma which is formed along the selected surface of the ion target material and retained between the walls; and (2) as a means for establishing a sufficiently strong magnetic field to maintain the B×E field relationship and to entrap secondary electrons along a substantial portion of the selected surface to insure uniform erosion thereof.

A yet further advantage of the present invention is that the ion target selected surface can be formed of a magnetic material or nonmagnetic material.

A yet further advantage of the present invention is that the walls can be formed of electrically insulating material, a material which can clamp the target or be integral with and formed of the target material, which permits operation of the improved cross-field diode sputtering target assembly for diode sputtering applications.

A yet further advantage of the present invention is that the improved cross-field diode sputtering target assembly can be made into rectangular closed loop shape or pattern to permit easy fabrication of a replaceable ion target selected surface in an ion target.

A yet further advantage of the present invention is that the magnetic means can be formed of a first magnetic means which is located adjacent one outer edge of the ion target and a second magnetic means which is located on the other side of the raised wall opposite the other edge of the ion target selected surface.

A yet further advantage of the present invention is that a variable magnetic control means can be operatively coupled to the magnetic means for controlling the density of the magnetic field being applied across a selected surface and through the ion target.

A yet further advantage of the present invention is that the improved cross-field diode sputtering target assembly can be utilized in a method for controlling the erosion pattern of a selected surface of an ion target.

A yet further advantage of the present invention is that the method for controlling the erosion pattern of a selected surface of ion target material can be easily and predictibly controlled by applying an electric field (E) in a first direction across the selected surface, enclosing the space edges of the selected surface of the ion target with walls and applying in a second direction which is substantially perpendicular to the first direction a linear magnetic field (B) through the electrically insulating walls, across the selected surface and through the ion target to develop a B×E field and to entrap secondary electrons at the selected surface to control the erosion pattern thereof.

BRIEF DESCRIPTION OF THE DRAWING

The foregoing and other advantages and features of this invention will become apparent from the following description of the preferred embodiment, when considered together with the illustrations in the accompanying drawing which includes the following Figures:

FIG. 1 is a pictorial representation of the erosion pattern of a prior art magnetically enhanced diode sputtering target assembly;

FIG. 2 is a pictorial representation of the improved cross-field diode sputtering target assembly utilizing the teachings of the present invention;

FIG. 3 is a end cross-sectional view of an improved cross-field diode sputtering target assembly in a diode sputtering system;

DESCRIPTION OF THE PREFERRED EMBODIMENT

Figure 4:
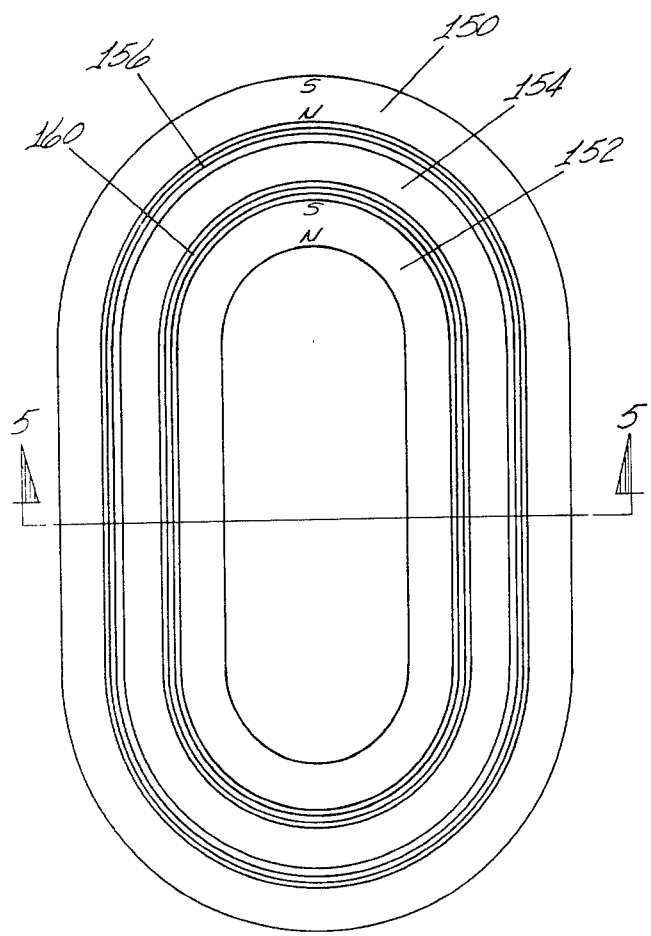
FIG. 4 is a top plan view illustrating an improved cross-field diode sputtering target assembly formed into an oval shape structure.

As noted hereinbefore, FIG. 1 is a representation of the magnetically enhanced sputtering target assembly of the prior art having magnets 28 located thereunder. The arcurate-shaped lines of force 20 and 26 are formed in a closed-loop configuration which results in disruption of the required B×E field relationship, which B×E field relationship is required in order to permit sputtering to occur. The surface 22 of the target erodes in a V-shaped trench, shown by line 24.

FIG. 2 is a diagrammatic configuration of an improved cross-field diode sputtering target assembly utilizing the teachings of the present invention. As illustrated in FIG. 2, the improved cross-field diode sputtering target assembly includes an ion target 46 having a predetermined surface 50 formed into a predetermined closed loop shape, having a hollowed-out central area such as a rectangular shape or an oval shape. The ion target 46 has a selected surface having spaced edges. The ion target surface 50 is formed of a material which is adapted to be controllably eroded in a sputtering process. In the embodiment illustrated in FIG. 2, the ion target material is formed completely of the selected material to be sputtered with the side walls 40 formed of a different material which clamps the target place. However, it is envisioned that the ion target 46 could be formed of one material at the bottom portion thereof with the top selected surface thereof 50 formed of a different ion target material. Also, the walls could be adjacent to the target but spaced to permit the walls to be electrically floating. It is important that the ion target material has sufficient depth and width so as to present an overall surface which can be controllably eroded in a sputtering process.

In the embodiment of FIG. 2, means positioned contiguous to each of the spaced edges of the selected surface 50 of the ion target 46 is utilized for defining a pair of walls 40. The walls 40 are in contact with and extend substantially normal from and beyond each of the spaced edges of the selected surface 50 of the ion target 46.

A housing, such as housing 42, may be positioned relative to the walls 40 so as to provide a specific cavity into which the plasma will be contained. For diode sputtering, the housing itself may be water cooled and used as the anode.

A magnetic means having poles, such as a north pole and south pole illustrated by first magnetic pole member 52 and second magnetic pole member 54, are positioned in opposed spaced relationship to each other and enclose the walls 40 and the ion target 46. The poles 52 and 54 of the magnetic means produce a linear magnetic field (B) which extends from the magnetic poles through the walls 40 over the selected surface 50 and through the ion target 46. In this manner, the linear magnetic field (B) performs two functions: namely, (1)

acts as a cover for plasma entrapment between the walls 40 which define the sidewalls of a cavity and the selected surface 50 which define the bottom portion of the cavity; and (2) directs magnetic flux through the target assembly and over the selected surface of the ion target which entraps secondary electrons. The linear magnetic field is of sufficient strength to insure plasma entrapment between the walls and over the selected surface 50. In sputtering systems, the E field, illustrated by the arrow having E illustrated in FIG. 2, is adapted to be applied across the selected surface in a direction substantially normal to the magnetic field (B), which is illustrated by the arrow in B in FIG. 2, to develop a $B \times E$ field at the selected surface 50. The direction of velocity in which electrons will be accelerated by the $B \times E$ field is illustrated by vector $V_e$, which vector is directed out of the drawing.

If desired, a magnetic coupling member 56 can be utilized to couple the north pole of the first magnetic pole 52 to the south pole of magnetic member 54 to provide a closed flux path for the magnetic field. Also, it is possible to control the density of the magnetic field by use of windings 58 formed around each of the pole pieces 52 and 54. The windings are coils 58 are operatively coupled to a variable magnetic field control means 64. The variable magnetic field control means 64 can vary the density of the linear magnetic field (B) to insure it is at a sufficient strength for plasma and secondary electron entrapment and for maintaining the $B \times E$ relationship along the entire selected surface of the ion target.

Also, as illustrated in FIG. 2, improved cross-field diode sputtering target assembly can be utilized in diode sputtering apparatus. In an alternative arrangement, the improved cross-field diode sputtering target assembly can utilize an anode in the form of a conductor 38 which is positioned in a spaced relationship from the means defining the walls 40. The anode is operatively connected to the ion target 46, which forms the selected surface into a cathode, for producing electrons between the anode 38 and the target 46, enabling diode sputtering of the surface of the ion target in a controlled erosion pattern. This arrangement permits a diode sputtering apparatus to sputter magnetic material in a controllable manner.

FIG. 3 is a cross-sectional view of a preferred embodiment of a sputtering apparatus utilizing the teaching of the present invention. As illustrated in FIG. 3, the housing includes a top 110, a side member 112 and a bottom member 114. The target assembly illustrated generally as 124 includes walls 120, which are formed of a material different from the target material. The ion target 124 has a selected surface 126, which is formed on the top surface thereof and which is adapted to be a replaceable sputtered material segment. During the controlled erosion of the target 126, the pattern formed in the target surface 130 is similar to that illustrated by line 48 in FIG. 2.

In the embodiment illustrated in FIG. 3, the sputtering apparatus is adapted to efficiently erode the selected surface 130 of the ion target material 126 forming a portion of the ion target 124 such that a substantial portion of the ion target material can, in fact, be sputtered, resulting in highly efficient removal of the target material in a diode sputtering system.

The embodiment in FIG. 3, which may be utilized in a diode sputtering arrangement as described hereinabove, uses a linear magnetic field for plasma and secondary electron entrapment which, in turn, enables the diode sputtering apparatus to efficiently sputter magnetic material.

In the alternative, the magnetic target 126 in FIG. 3 may be formed of a number of magnetic materials, for example, a nickel-ferrous alloy, in a predetermined ratio such that a magnetic material having variable magnetic properties can be controllably sputtered by utilizing the teachings of the present invention.

Figure 5:
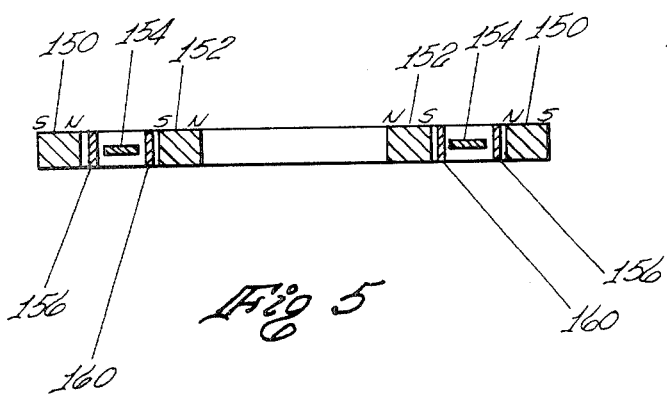
FIG. 5 is a pictorial representation of a cross section of the improved cross-field diode sputtering target assembly taken along Section lines 5—5 of FIG. 4.

FIGS. 4 and 5 illustrate an alternate arrangement wherein the ion target assembly has magnetic members and an ion target selected surface, all of which are cross sectional in shape and which form an oval-shaped, improved diode cross-field sputtering target assembly. Specifically, the ion target surface 154 is positioned between magnetic pole members 150 and 152 with the walls 156 and 160 interposed therebetween. In this embodiment, the walls are electrically floating walls. As illustrated in FIG. 5, the magnetic members 150 and 152 apply the linear magnetic field through the walls 156 and 160 to provide the dual function of plasma and secondary electron entrapment and maintaining the $B \times E$ field relationship. As illustrated in FIG. 5, the geometrial dimension of the magnetic members 150 can be smaller than the geometrical dimension of the target material 154, and the second pole piece or magnetic member 152 can have a different dimension than the dimension of the first magnetic member 150 and the ion target 154. The strength of the linear magnetic field (B) can be controlled by controlling the size of the magnets. This would be desirable in a rectangular-shaped configuration.

Figure 6:
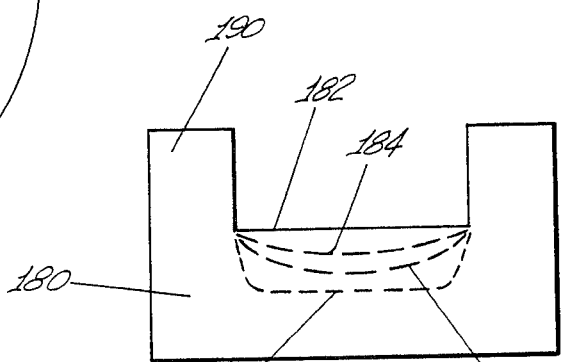
FIG. 6 is a pictorial representation of a plurality of erosion configurations of a selected surface of an ion target assembly having the walls formed of a target material.

FIG. 6 illustrates ion target 180 having walls and a rectangular-shaped cross section formed of the same material. The target is adapted to have the entire selected surface 182 thereof eroded in a controllable erosion pattern characteristic. For example, during initial erosion of the surface 182, the shape of the surface may become somewhat arcuate-shaped, as illustrated by dashed line 184. As the sputtering process continues and the $B \times E$ field relationship is maintained by the linear magnetic field, the erosion pattern then begins to take on a relatively rectangular shape, as illustrated by the dashed line 186. As the ion target material is further eroded, the pattern becomes almost square-shaped, as illustrated by dashed line 188, which results in a substantial portion of the target material being consumed during the sputtering process. Note that the walls are not eroded due to the absence of the $B \times E$ field. In use, the walls may even have target material sputtered thereon from the selected surface.

The improved cross-field diode sputtering target assembly illustrated in FIG. 2 can be utilized in a unique and novel method for controlling the erosion pattern of an ion target in a diode apparatus. The method for controlling the erosion pattern of a cross-field diode sputtering target assembly comprises the steps of applying an electric field (E) in a first direction across a predetermined surface of an ion target formed of a selected material having spaced edges, enclosing the spaced edges of the selected surface of the ion target with walls and applying in a second direction, which is substantially perpendicular to the first direction, a linear magnetic field (B) through the walls, across the selected surface and through the target. The linear magnetic field (B) is of sufficient strength for plasma and secondary electron entrapment between the walls and over the selected surface. Thus, by use of the electrical field (E)

and the magnetic field (B), a B×E field is developed at the selected surface of the ion target to control the erosion pattern thereof. The step of producing a supply of secondary electrons by means of an anode and the selected surface of the ion target material operatively connected as a cathode, so as to enable cathode sputtering of the selected surface of the ion target.

In addition, the density of the linear magnetic field may be controlled in a number of ways, for example, by the use of a variable magnetic field control means. By varying the density of the magnetic field (B), the B×E field is likewise varied, which in turn varies the erosion pattern of the selected surface.

As noted above, the method disclosed herein can be utilized for controllably eroding a selected material which is formed of a magnetic material such as Ni—Fe or of a nonmagnetic material such as copper.

What is claimed is:

1. An improved cross-field diode sputtering target assembly comprising
   an ion target having a selected surface formed of a selected material, said ion target being formed into a predetermined closed loop pattern having a central opening therein, said selected surface having spaced edges and wherein the selected surface is adapted to be controllably eroded in a sputtering process;
   means positioned in operative relationship to each of the spaced edges of said selected surface for forming walls which extend substantially normal from and beyond each spaced edge of said selected surface of the ion target; and
   magnetic means having poles positioned in an opposed spaced relationship to each other and enclosing said means for defining said walls and said ion target for producing a linear magnetic field (B) through the walls, over the selected surface and through the ion target, said magnetic means having a linear magnetic field of sufficient strength for plasma entrapment between said walls and over said selected surface wherein said selected surface is adapted to have an electric field (E) applied thereacross at a direction substantially normal to the magnetic field (B) to develop a B×E field and to entrap secondary electrons at said selected surface to control the erosion pattern thereof.

2. The improved cross-field diode sputtering target assembly of claim 1 wherein the means defining the walls clamps the ion target in a position wherein the selected surface extends there between.

3. The improved cross-field diode sputtering target assembly of claim 1 whereon the means defining the walls are separate, spaced electrically floating walls.

4. The improved cross-field diode sputtering target assembly or claim 1 wherein the means defining the walls are integral with and are formed of the ion target material.

5. The improved cross-field diode sputtering target assembly of claim 1 wherein said ion target selected surface is formed of a magnetic material.

6. The improved cross-field diode sputtering target assembly of claim 1 wherein said ion target selected surface is formed of a nonmagnetic material.

7. The improved cross-field diode sputtering target assembly of claim 1 wherein said magnetic means includes
   a first magnetic means located adjacent one edge of said ion target selected surface and adjacent said raised wall; and
   a second magnetic means located on the other side of said raised wall opposite the other edge of the ion target selected surface.

8. The improved cross-field diode sputtering target assembly of claim 1 further comprising
   variable magnetic control means operatively coupled to said magnetic means for controlling the density of the magnetic field being applied across the selected surface and through the ion target.

9. The improved cross-field diode sputtering target assembly of claim 1 further comprising
   means including an anode which is positioned in a spaced relationship from said means defining said walls and operatively connected to said ion target forming the selected surface into a cathode for producing electrons therebetween, enabling diode sputtering of the selected surface of the ion target in a controlled erosion pattern.

10. A method for controlling the erosion pattern of a cross-field diode sputtering target assembly comprising the steps of
    applying an electric field (E) in a first direction across a selected surface of an ion target formed into a predetermined closed loop pattern having a central opening therein and having a selected material including spaced edges;
    enclosing the spaced edges of the selected surface of the ion target material with walls; and
    applying in a second direction which is substantially perpendicular to said first direction a linear magnetic field (B) through the walls, across the selected surface and through the target, wherein the linear magnetic field (B) is of sufficient strength for plasma and secondary electron entrapment between said walls and over the selected surface to develop a B×E field at said selected surface to control the erosion pattern thereof.

11. The method of claim 10 further comprising the step of
    producing a supply of electrons between an anode and the selected surface operatively connected as a cathode enabling diode sputtering of the selected surface of the ion target.

12. The method of claim 10 further comprising the step of
    controlling the density of the linear magnetic field which varies the B×E field which varies the erosion pattern of the selected surface of the ion target during diode sputtering.

13. The method of claim 11 wherein a portion of the selected target material is formed of a magnetic material.

14. The method of claim 11 wherein a portion of the selected target material is formed of a nonmagnetic material.

15. The method of claim 11 wherein the walls are contiguous to the ion target.

16. The method of claim 11 wherein the walls are adjacent to the ion target.

17. The method of claim 11 wherein the walls are integral with and are formed of the ion target material.

* * * * *